United States Patent
Dabral

(10) Patent No.: US 6,639,450 B2
(45) Date of Patent: Oct. 28, 2003

(54) ENHANCED CONDUCTIVITY BODY BIASED PMOS DRIVER

(75) Inventor: Sanjay Dabral, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/314,308

(22) Filed: Dec. 9, 2002

(65) Prior Publication Data

US 2003/0062946 A1 Apr. 3, 2003

Related U.S. Application Data

(62) Division of application No. 09/475,648, filed on Dec. 30, 1999, now Pat. No. 6,515,534.

(51) Int. Cl.⁷ ................................................ H03K 3/01
(52) U.S. Cl. ........................................................ 327/534
(58) Field of Search ................................ 327/427, 530, 327/534, 535, 537, 564, 565, 566

(56) References Cited

U.S. PATENT DOCUMENTS

| | | | |
|---|---|---|---|
| 5,461,338 A | | 10/1995 | Hirayama et al. |
| 5,557,231 A | | 9/1996 | Yamaguchi et al. |
| 5,559,368 A | | 9/1996 | Hu et al. |
| 5,610,533 A | * | 3/1997 | Arimoto et al. ............... 326/33 |
| 5,644,266 A | * | 7/1997 | Chen et al. ................... 327/534 |
| 5,689,144 A | | 11/1997 | Williams |
| 5,689,209 A | | 11/1997 | Williams et al. |
| 5,783,935 A | * | 7/1998 | Kyung ......................... 323/313 |
| 5,786,724 A | * | 7/1998 | Teggatz ....................... 327/534 |
| 6,046,627 A | * | 4/2000 | Itoh et al. .................... 327/546 |
| 6,100,751 A | | 8/2000 | De et al. |
| 6,111,455 A | * | 8/2000 | Eleyan et al. ................ 327/537 |
| 6,166,584 A | | 12/2000 | De et al. |
| 6,218,895 B1 | | 4/2001 | De et al. |
| 6,300,819 B1 | | 10/2001 | De et al. |
| 6,493,430 B2 | | 12/2002 | Leuca et al. |

OTHER PUBLICATIONS

Excerpt from "1996 IEEE International SOI Conference Proceedings" (Oct. 1996) p. 141.

Antoniadis, D.A. and Chung, J.E., "Physics And Technology Of Ultra Short Channel MOSFET Devices", *IEDM Technical Digest* (1991) pp. 2.1.1–2.1.4.

Aoki, M. et al., "0.1 μm CMOS Devices Using Low–Impurity–Channel Transistors (LICT)", *IEDC Technical Digest*, (1990) pp. 9.8.1–9.8.3.

Assaderaghi, F. et al., "High–Performance Sub–Quarter–Micrometer PMOSFET's on SOI", *IEEE Electron Device Letters*, vol. 14, No. 6 (Jun. 1993) pp. 298–300.

Assaderaghi, F. et al., "A Dynamic Threshold Voltage MOSFET (DTMOS) For Ultra–Low Voltage Operation", *IEDM Technical Digest*, (1994) pp. 33.1.1–33.1.4.

Kioi, K. et al., "Forward Body–Bias SRAM Circuitry On Bulk Si With Twin Double–Well", *Electronics Letters*, vol. 33, No. 23 (Nov. 1997) pp. 1929–1930.

(List continued on next page.)

*Primary Examiner*—Jeffrey Zweizig
(74) *Attorney, Agent, or Firm*—Kenyon & Kenyon

(57) ABSTRACT

According to one embodiment of the present invention a method for biasing a body of a transistor. The method includes detecting a voltage applied to a terminal of a transistor and coupling a biasing voltage to the body based upon the detected voltage.

10 Claims, 4 Drawing Sheets

OTHER PUBLICATIONS

Kioi, K.. et al., "Forward Body–Bias MOS (FBMOS) Dual Rail Logic Using An Adiabatic Charging Technique With Sub–0.6V Operation" *Electronics Letters*, vol. 33, No. 14 (Jul. 1997) pp. 1200–1201.

DeChiaro, L.F. and Sandroff, C.J., "Improvements In Electrostatic Discharge Performance InGaAsP Semiconductor Lasers By Facet Passivation" *IEEE Transactions On Electron Devices*, vol. 39, No. 3 (Mar. 1992) pp. 561–565.

Kotaki, H. et al., "Novel Bulk Dynamic Threshold Voltage MOSFET (B–DTMOS) With Advanced Isolation (SITOS) And Gate To Shallow–Well Contact (SSS–C) Processes For Ultra Low Power Dual Gate (CMOS)", *IEDM Technical Digest* 96–459 (1996) pp. 17.7.1–17.7.2, 17.7.4.

Kawaguchi, H. et al., "A CMOS Scheme For 0.5 V Supply Voltage With Pico–Ampere Standby Current", *IEEE International Solid–State Circuits Conference, Session 12/TD: Low–Voltage and Multi–Level TEchniques*, Paper FP 12.4, (1998) pp. 192–193.

Kuroda, T. and Sakurai, T., "Threshold–Voltage Control Schemes Through Substrate–Bias For Low–Power High–Speed CMOS LSI Design", *Journal of VLSI Signal Processing Systems 13*, (1996) pp. 107–117.

Kuroda, T. et al., "Substrate Noise Influence On Circuit Performance In Variable Threshold–Voltage Scheme", *International Symposium On Low Power Electronics And Design*, (Aug. 1996) pp. 309–312.

Kuroda, T. et al., "Variable Supply–Voltage Scheme For Low–Power High–Speed CMOS Digital Design", *IEEE Journal Of Solid–State Circuits*, vol. 33, No. 3 (Mar. 1998) pp. 454–462.

Kuroda, T. et al., "A 0.9–V, 150–MHz, 10–mW, 4mm$^2$, 2–D Discrete Cosine Transform Core Processor With Variable Threshold–Voltage (VT) Scheme", *IEEE Journal of Solid–State Circuits*, vol. 31, No. 11 (Nov. 1996) pp. 1770–1779.

Kuroda, T. et al., "FA 10.3: A 0.9V 150 MHz, 10mW, 4mm$^2$, 2–D Discrete Cosine Transform Core Processor With Variable Threshold–Voltage (VT Scheme", *IEEE International Solid–State Circuits Conference*, (1996).

Mutoh, S. et al., "1–V Power Supply High–Speed Digital Circuit Technology With Multithreshold–Voltage CMOS", *IEEE Journal Of Solid–State Circuits*, vol. 30, No. 8 (Aug. 1995) pp. 847–853.

Oowaki, Y. et al., "TP 6.2: A Sub–0.1 µm Circuit Design With Substrate–Over Biasing", *IEEE International Solid–State Circuits Conference*, (1998).

Rodder, M. et al., "A Sub–0.18µm Gate Length CMOS Technology For High Performance (1.5V) And Low Power (1.0V)", *IEDM Technical Digest* 96–563 (1996) pp. 563–566.

Rofail, S. and Y. Seng, "Experimentally–Based Analytical Model Of Deep–Submicron LDD pMOSFET's In A Bi–MOS Hybrid–Mode Environment", *IEEE Transactions On Electron Device*, vol. 44, No. 9 (Sep. 1997) pp. 1473–1482.

Sakurai, T. et al., "Low–Power CMOS Design through $V_{TH}$ Control and Low–Swing Circuits", *International Symposium On Low Power Electronics And Design*, (Aug. 1997) pp. 1–6.

Splain, C. and Kenneth, K.O., "Ultra Low Voltage Complementary Metal Oxide Semiconductor (ULV–CMOS) Circuits: Bulk CMOS Operation Below Threshold ($V_{TO}$)", *IEEE Southeastcon '96—Bringing Together Education, Science And Technology*, (1996) pp. 670–673.

Streetman, B., "Section 8.3 The Metal–Insulator–Semiconductor Fet", *Solid State Electronic Devices, 2nd Edition, Library of Congress*, (1980) pp. 317–319.

Thompson, S. et al., Dual Threshold Voltages And Substrate Bias: Keys To High Performance, Low Power, 0.1 µm *Logic Designs, Symposium On VLSI Technology Design Of Technical Papers*, (1997) pp. 69–70.

Wong, Louis S.Y. et al., "SA 17.4: A 1V CMOS Digital Circuits with Double–Gate–Driven MOSFET", ISSCC97/ Session 17/TD: Low–Power/Low–Voltage Circuits/Paper SA 17.4, *Digest of Technical Papers*.

Walker, W. et al., "Design And Analysis Of A CMOS SOS/SOI Receiver For A Radiation Hard Computer", *IEEE SOS/SOI Technology Conference*, (Oct. 1989) pp. 167–168.

Wann, H. Clement et al., "Channel Doping Engineering OF MOSFET With Adaptable Threshold Voltage Using Body Effect For Low Voltage And Low Power Application", *International Symposium On VLSI Technology, Systems and Applications—Proceedings Of Technical Papers*, (1995) pp. 159–163.

Wann, Clement H. et al., "A Comparative Study of Advanced MOSFET Concepts", *IEEE Transactions On Electron Devices*, vol. 43, No. 10, (Oct. 1996) pp. 1742–1751.

Williams, R. et al., "MOSFET Flyback–Diode Conduction and dV/dt Effects in Power ICs in Low–Voltage Motor Control Applications", Proceedings of the 3rd International Symposium on Power Semiconductor Devices and ICs, (Jun. 1991), pp. 254–257.

* cited by examiner

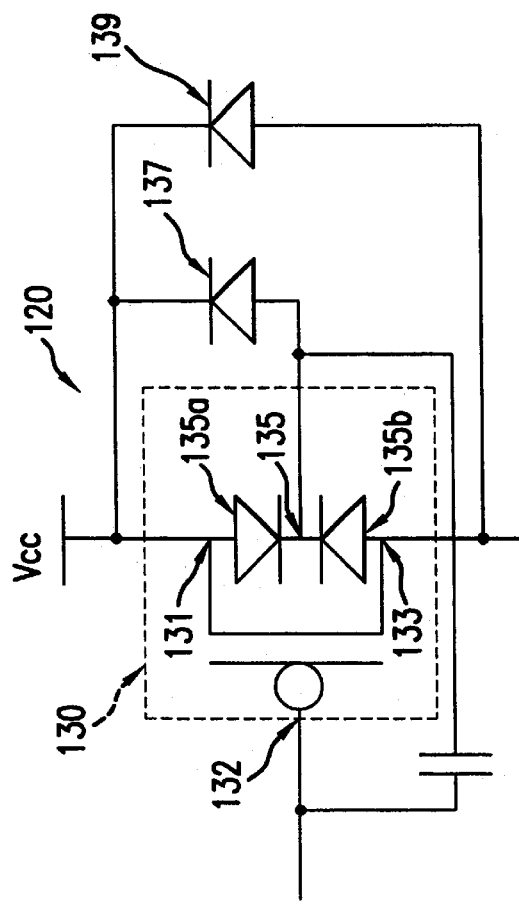
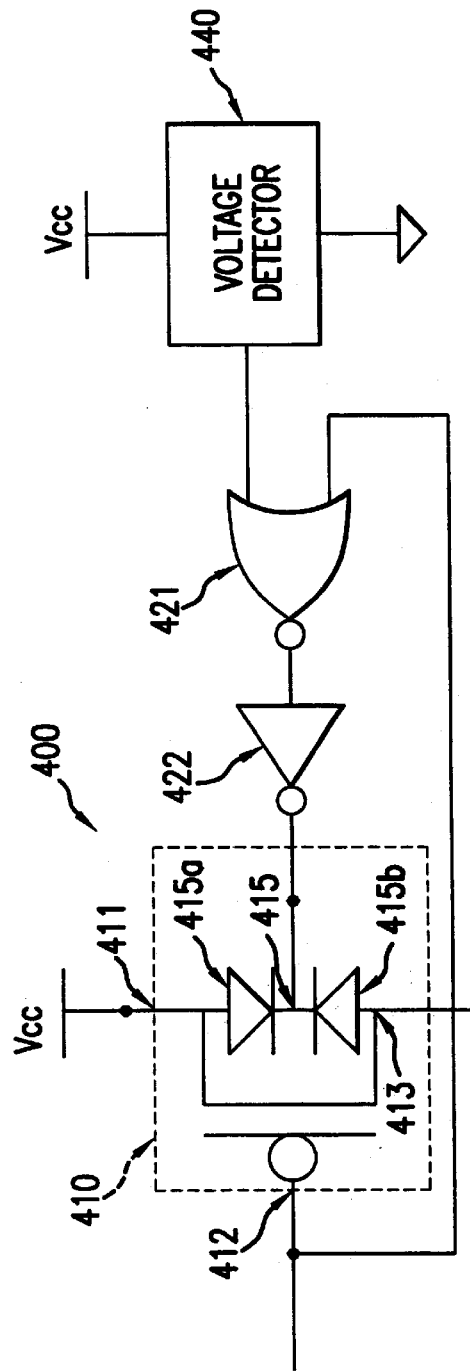

ENHANCED CONDUCTIVITY BODY BIASED PMOS DRIVER

CROSS-REFERENCE TO RELATED APPLICATIONS

This patent application is a divisional application of U.S. application Ser. No. 09/475,648, filed Dec. 30, 1999, U.S. Pat. No. 6,515,534 and is incorporated herein by reference and may benefit from the priority thereof.

FIELD OF THE INVENTION

The present invention pertains to the field of semiconductor circuits. More particularly, the present invention pertains to semiconductor circuits having a transistor whose body is biased.

BACKGROUND OF THE INVENTION

A conventional complementary metal oxide semiconductor (CMOS) transistor typically has to be able to provide a certain level of drive current in order to reliably communicate with or control or drive another device. The drive current is a function of the threshold voltage of the transistor and the voltage levels applied to the terminals of the transistor, among other factors. The threshold voltage, Vt, may be defined as the voltage applied between the gate and source below which the drive or drain-to-source current, Ids, drops to very close to zero.

Transistors which are designed to be used with relatively high voltage levels (high voltage level transistors) and which have a relatively high threshold voltage may produce relatively high drive currents if they are used in circuits supplying relatively high voltage levels. Problems, however, arise when attempting to use a high voltage level transistor in a low voltage level circuit. For example, if a transistor which is designed for use with 3.3 volts at its terminals is used in a circuit supplying 1.5 volts the drive current produced by the transistor is likely to be rather low in comparison to the same transistor used in a circuit providing 3.3 volts. An input/output (I/O) buffer is an example of a situation where multiple voltages may need to be supported by a transistor. Part of the low performance is due to the large threshold voltage inherent in a transistor designed for use with 3.3 volts. Typically, if a transistor is to be used with a large voltage applied to the source, source voltage, the gate oxide is made relatively thick in order to prevent oxide breakdown of the gate oxide which may render the transistor inoperable. Unfortunately, the threshold voltage increases as the thickness of the gate oxide of a transistor increases, causing the drive current to decrease. Consequently, when a transistor having a large threshold voltage is used with terminal voltages that are lower than the voltages it was designed to be used with, the drive current is typically relatively low.

However, the drive current can be increased by changing the threshold voltage. With a lower threshold voltage, a transistor can provide a greater drain current for a given voltage applied between the gate and source, Vgs. Circuit schemes have been proposed where a forward bias is applied statically or dynamically to the body node of a metal oxide semiconductor field effect transistor (MOSFET) to decrease the threshold voltage and increase the drive current when the MOSFET is turned on.

An example of a circuit scheme which allows transistors to have both a higher drive current when turned on and a lower leakage current when turned off is illustrated in FIGS. 1a and 1b. FIGS. 1a and 1b illustrate a circuit 100 which includes transistor 110 having a source 111 at a source voltage VCC, a drain 113, and a gate 112. Gate 112 is coupled to coupling capacitor 114 which in turn is coupled to the body 115 of transistor 110. Circuit 100 includes explicitly placed diode 117 which couples source 111 to tap 116. Transistor 110 includes parasitic diodes 115a and 115b.

Transistor 110 is a p-channel metal oxide semiconductor (PMOS) transistor in which a body or substrate is a doped n type material, and source 111 and drain 113 are each of p+ type material. An n or n+ type material refers to material to which donor dopant has been added to increase the electron concentration. An n+ material has an even greater electron concentration than n type material. A p or p+ type material refers to material to which acceptor dopant has been added to increase the hole concentration. A p+ material has an even greater hole concentration than p type material. A n+ type tap provides a path from coupling capacitor 114 to body 115. When the gate voltage is low, a channel 118 provides a path between source 111 and drain 113. Transistor 110 has a threshold voltage Vt that may be defined as the voltage applied between the gate and source below which the drive or drain-to-source current, Ids, drops to very close to zero.

A body bias is applied to body 115 through tap 116. When transistor 110 is in an active mode, the body bias is such that a forward bias is applied to body 115. The threshold voltage without forward body bias is Vt(NFB). The threshold voltage with a forward bias is Vt(WFB). In practice, |Vt(WFB)| is lower than |Vt(NFB)|. With a lower threshold voltage, transistor 110 can provide a greater drive current for a given Vgs. For example, transistor 110 in a forward body bias condition can provide the same drive current with a lower Vgs as compared to transistor 110 not in a forward bias condition. Likewise, transistor 110 in a forward bias condition can provide a greater drive current with the same Vgs and Vcc as compared to transistor 110 not in a forward bias condition.

Since a forward bias has a tendency to increase leakage current of transistor 110, which is undesirable, it desirable to reverse bias body 115 when transistor 110 is off. In circuit 100, body 115 is reverse biased when transistor 110 is in an inactive mode and the body is at Vcc or a higher potential.

Unfortunately, circuit 100, since it was designed for use in the core of an integrated circuit, does not provide good electrostatic discharge (ESD) protection, has a capacitor 114 which takes up a relatively large area, and undergoes modulation of the threshold voltage due to noise.

During an ESD, kilovolts of voltage may be placed across a device for nanoseconds. One way to address this issue is to place an explicit large ESD diode 139 in parallel with transistor 130 as illustrated in FIG. 1c. FIG. 1c illustrates a circuit for biasing the body of a transistor having electrostatic discharge protection. Diode 139 is forward biased when drain 133 is at a higher voltage with respect to source supply voltage, Vcc. However due to high currents and resistance of diode 139, voltages upwards of 1V may exist between drain 133 and the Vcc even when the ESD diode is clamping. Therefore, diode 135b and diode 137 are forward biased and conduct. Since diode 137 is small, it cannot handle large currents, and can be easily destroyed. Consequently, diode 137 either needs to be sized up significantly, or another mechanism for dealing with ESD's needs to be provided. Increasing the size of diode 137 may be undesirable in applications where die area is limited.

Similarly, coupling capacitor 114 takes up a relatively large die area which may be undesirable in applications where area is limited.

Circuit 100 does not provide for the communication of the body bias produced by coupling capacitor 114 to bodies other than the body of the transistor to which capacitor 114 is coupled. In a typical I/O circuit which has actual drivers that communicate with an external bus, the impedance of the drivers is dynamically adjusted or compensated by using a calibration cell which contains a calibration driver whose impedance is matched to a reference impedance. The adjustments or compensation made to the calibration driver impedance are also made to the actual drivers. For the compensation to be properly made, a common bias needs to be used for both the actual drivers and the calibration driver or drivers. Since capacitor 114 does not provide for relatively easy and repeatable communication of substantially the same bias to multiple transistors, compensation may not be properly done.

Additionally, circuit 100 does not have a very good conduction path when it is operating between regions where diode 117 is conducting (gate 112 going from low to high) or when diode 115*a* is conducting (gate 112 going from high to low). This leaves a window between (Vcc+voltage drop across diode 117) and (Vcc−voltage drop across diode 115*a*) when the N-well is relatively floating. Any I/O noise caused by reflections, bus switching, or other noise sources is coupled into the N-well and cannot be dissipated. This noise modulates the threshold voltage. The diodes 117 and 115*a* and capacitor 114 also form a peak detect circuit. For example if diode 115*a* is conducting, then the highest voltage achieved by the Vcc will bias the N-well to (Vccmax−Vdiode 115*a*) level. When the source supply voltage, Vcc, collapses, the N-well cannot track as there is no conduction path.

Since ESD impulse may destroy a transistor, it is desirable to provide a relatively larger drive current when the transistor is turned on using a circuit scheme that will provide relatively better protection from ESD impulses without the area cost of an added ESD diode. Furthermore, since a coupling capacitor takes up a relatively large die area, it is desirable to provide a relatively larger drive current when the transistor is turned on using a circuit scheme that does not require a capacitor. Finally, it is desirable to provide a relatively larger driver current when the transistor is turned on using a circuit scheme that does not cause threshold voltage modulation.

SUMMARY OF THE INVENTION

According to one embodiment of the present invention a method for biasing a body of a transistor is described. The method includes detecting a voltage applied to a terminal of a transistor and coupling a biasing voltage to the body based upon the detected voltage.

BRIEF DESCRIPTION OF THE DRAWINGS

The present invention is illustrated by way of example, and not limitation, in the figures of the accompanying drawings in which:

FIG. 1*c* illustrates a circuit for biasing the body of a transistor having electrostatic discharge protection.

FIG. 4 illustrates a circuit for controlling a bias voltage applied to the body of a transistor according to one embodiment of the present invention.

DETAILED DESCRIPTION

A method and apparatus for controlling the drain current of a transistor. In the following description, for purposes of explanation, numerous specific details are set forth in order to provide a thorough understanding of the present invention. It will be evident, however, to one skilled in the art that the present invention may be practiced in many types of circuits, especially integrated circuits having a driver for a digital bus, without these specific details. In other instances well known operations, functions and devices are not shown in order to avoid obscuring the invention. Repeated usage of the phrases "in one embodiment," "in an embodiment," "an alternative embodiment," or "an alternate embodiment" does not necessarily refer to the same embodiment, although it may.

Figure 1A:
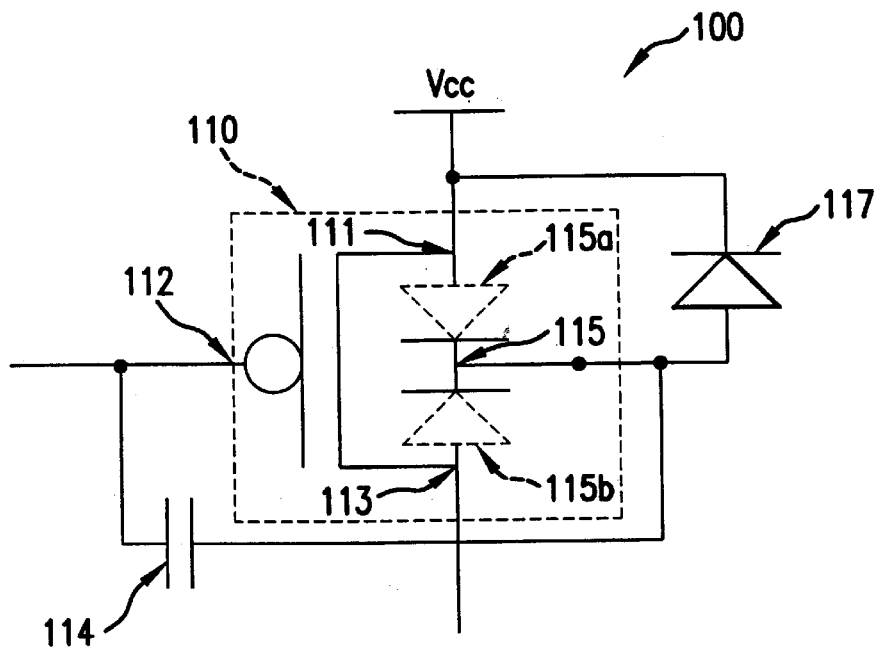
FIGS. 1*a* and 1*b* illustrate a circuit for biasing the body of a transistor.
Figure 1B:
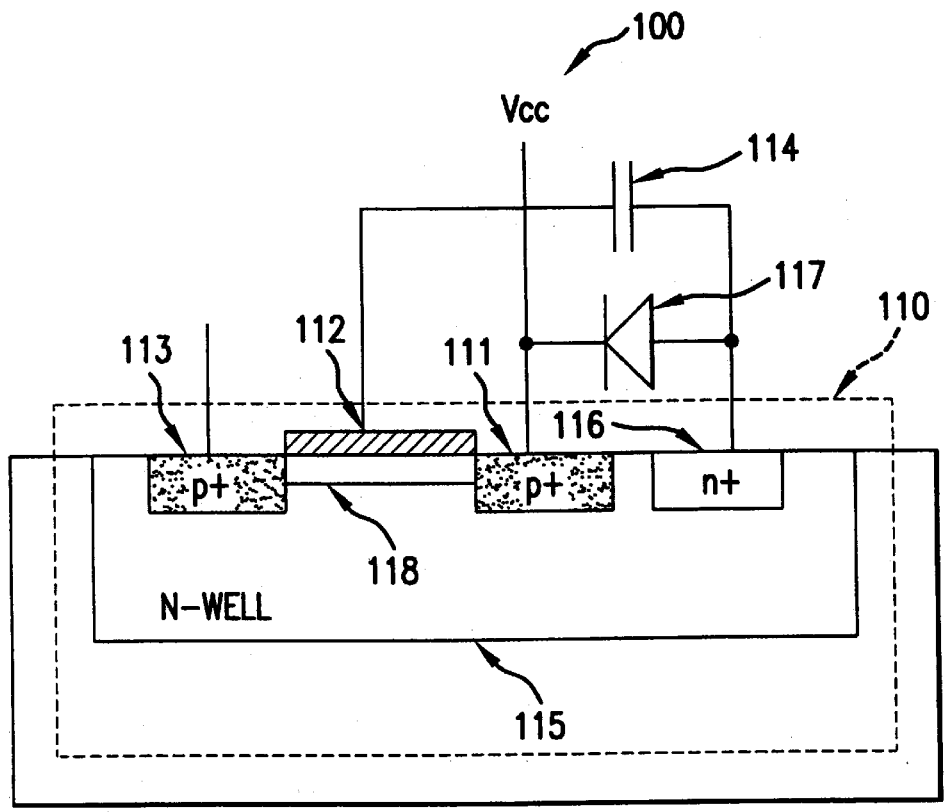
Figure 2A:
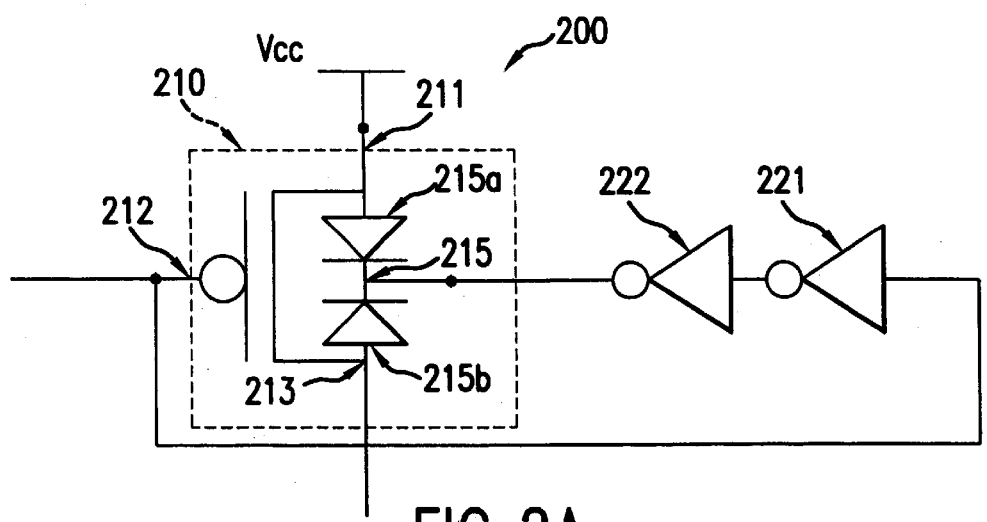
FIGS. 2*a* and 2*b* illustrate a circuit for biasing the body of a transistor according to one embodiment of the present invention.
Figure 2B:
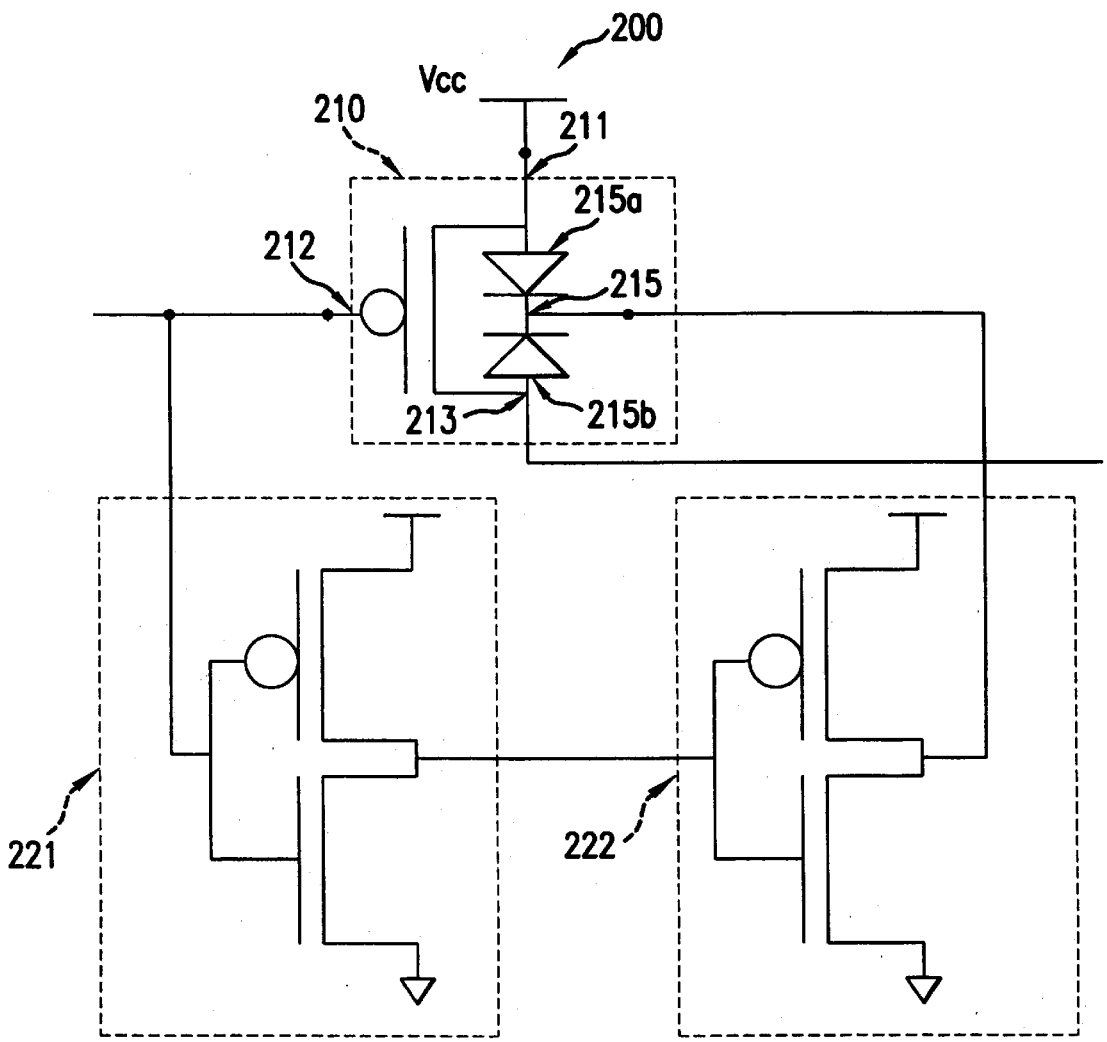

FIGS. 2*a* and 2*b* illustrate a circuit for controlling the drain current of a transistor for one embodiment in accordance with the present invention. Circuit 200 includes transistor 210 having a source 211 at a source voltage Vcc, a drain 213, and a gate 212 receiving a gate voltage Vg. Gate 212 is coupled to inverter 221 which is coupled to inverter 222 which in turn is coupled to a body 215 of transistor 110. For alternative embodiments in accordance with the present invention, there may be resistors, transistors or other elements between Vcc, Vg, and drain 213, source 211, and gate 212.

Transistor 210 is a p-channel metal oxide semiconductor (PMOS) transistor in which body 215 or substrate 215 is a doped n type material, and source 211 and drain 213 are each of p+ type material. n or n+ type material refers to material to which donor dopant has been added to increase the electron concentration. n+material has an even greater electron concentration than n type material. p or p+ type material refers to material to which acceptor dopant has been added to increase the hole concentration. p+ material has an even greater hole concentration than p type material. An n+ type tap (not shown) provides a path from inverter 222 to body 215. Transistor 210 includes parasitic diodes 215*a* and 215*b*. When Vg is low, a channel 218 provides a path between source 211 and drain 213. Transistor 210 has a threshold voltage, Vt, that may be defined as the voltage applied between the gate and source below which the drive or drain-to-source current, Ids, drops to very close to zero.

The threshold voltage, Vt, changes depending upon the voltage applied to the tap (not shown). When the gate is driven low, a low voltage is applied to the tap causing body 215 to be forward biased, leading to a lower Vt and an increase in drive current and faster switching for a given Vgs, Vcc, and Vds. Vgs is the gate to source voltage, and Vds is the drain to source voltage. When transistor 210 is in active mode, the voltage at tap 216 will be at (Vcc−voltage drop across parasitic diode 215*a*). On the other hand, when the gate is driven high, body 215 is driven to the same potential as Vcc leading to a nominal Vt.

Circuit 200 allows the drive current to be increased by forward biasing the body and without having to increase the size of transistor 210 or use a coupling capacitor. Increasing the drive current without increasing the size of the transistors or using coupling capacitors is desirable, since the size of transistors and the size of circuits that allow forward and reverse biasing is restricted in some applications.

In addition to lowering the Vt of transistor 210 without using a coupling capacitor between gate 212 and body 215, circuit 200 provides good electrostatic discharge (ESD) protection. An ESD impulse received at drain 213 will travel through parasitic diode 215b and body 215, emerge from tap 216 and travel through body of inverter 222 to ground, rather than hit the diode 117 and possibly destroy it. Providing good ESD protection may be essential for maintaining the integrity of circuits at the periphery of an integrated circuit that couple the integrated circuit to other external circuits.

An important feature is to share a common bias voltage among multiple I/O transistors. Some of these transistors can be employed in impedance compensation circuits and others employed for real I/O drivers and circuits. Therefore both the compensation and real I/O transistors operate at the same bias level.

Figure 3A:
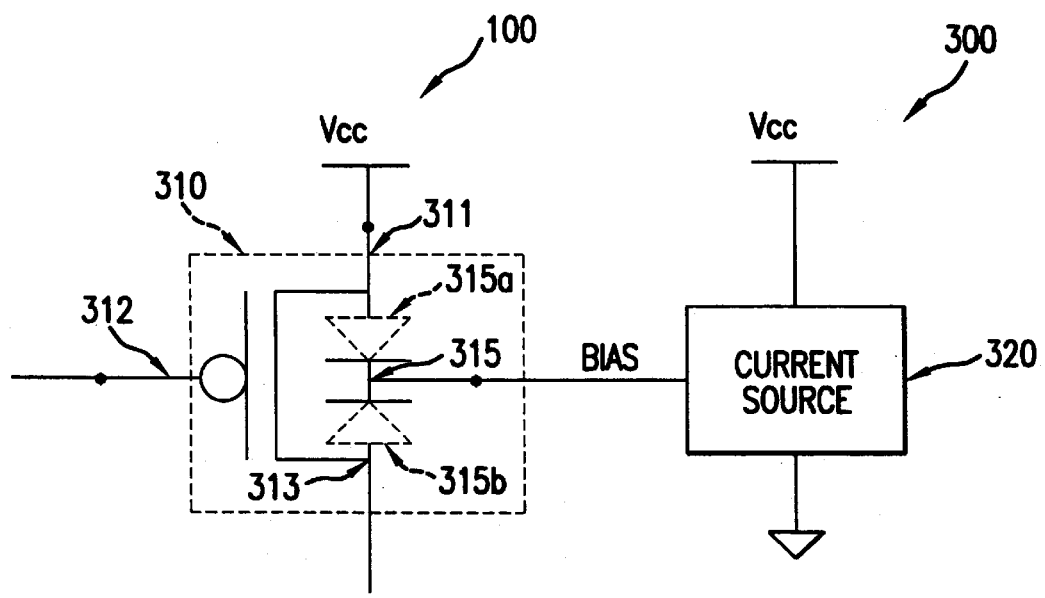
FIG. 3*a* illustrates a circuit for biasing the body of a transistor according to another embodiment of the present invention.

FIG. 3a illustrates a circuit for controlling the drain current of a transistor for one embodiment in accordance with the present invention. Circuit 300 includes current source 320, and transistor 310 which includes a source 311 at a source voltage Vcc received from a source voltage supply, a drain 313, and a gate 312 receiving a gate voltage Vg. Transistor 310 includes body 315 and tap (not shown) coupled to current source 320. Circuit 300 operates in a manner similar to circuit 200 and need not be described in great detail here. Transistor 310 includes parasitic diodes 315a and 315b. Current source 320 forces the current through diode 315a, thereby biasing body 315 with a bias voltage greater than (Vcc–the voltage drop across parasitic diode 315a), when the gate is driven by a low voltage. By forward biasing body 315, the threshold voltage of transistor 310 can be lowered improving the drain current. Current source 320 biases body 315 to Vcc when the gate is driven by a high voltage.

While in the description above current source 320 provides a bias to transistor 310, for alternative embodiments in accordance with this invention current source 320 provides a bias to multiple transistors. Being able to provide a common bias to multiple transistors is especially useful in I/O circuits. In a typical I/O circuit which has actual drivers that communicate with an external bus, the impedance of the drivers is dynamically adjusted or compensated by using a calibration cell which contains a calibration driver whose impedance is matched to a reference impedance. The adjustments or compensation made to the calibration driver impedance are also made to the actual drivers. For the compensation to be properly made, a common bias needs to be used for both the actual drivers and the calibration driver or drivers. For alternative embodiments, current source 320 provides a common bias to multiple transistors allowing compensation to be done in a more accurate manner.

In addition to lowering the threshold voltage of transistor 310 without using a coupling capacitor between gate 312 and body 315, circuit 300 provides good electrostatic discharge (ESD) protection since an ESD impulse at the drain is not directly coupled to a small diode.

Figure 3B:
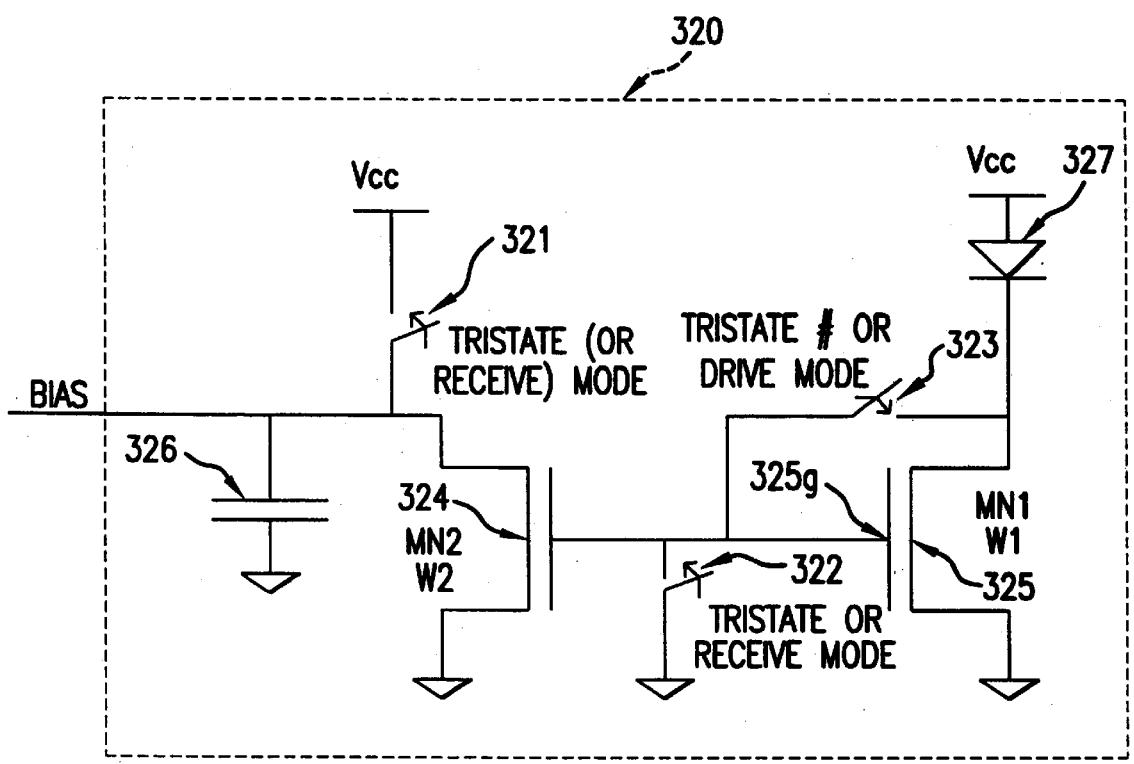
FIG. 3*b* illustrate a current source for biasing the body of a transistor according to one embodiment of the present invention.

FIG. 3b illustrates a current source for one embodiment in accordance with the present invention. Current source 320 includes n-channel metal oxide semiconductor (NMOS) transistor 324, NMOS transistor 325, bypass capacitor 326, switches 321, 322 and 323, and diode 327. When gate 312 of transistor 310 is driven low, switches 321 and 322 are opened, and switch 323 is closed causing diode 327 to conduct causing the voltage at gate 325g of transistor 325 to be Vcc–the voltage across diode 327. The voltage across diode 327 is referred to as Vdiode. Vdiode is a function of the doping levels and other design characteristics of diode d2. Transistors 324 and 325 form a current mirror. Transistor 324 will turn on because of (Vcc–Vdiode) at gate 325g. The degree to which transistor 324 turns on depends on how strongly transistor 325 turns on. The ratio of widths of transistors 324 to 325 sets the biasing current ratio in the combined diodes (315a) and diode 327. Since transistor 324 conducts, parasitic diode 31 Sa conducts causing a bias voltage (Vcc–voltage across parasitic diode 315a) to appear at body 315 of transistor 310. A capacitor 326 may be placed in the bias node to decouple any AC noise.

When the tristate signal is driven high, switch 323 is opened, and switches 321 and 323 are closed causing transistors 324 and 325 to turn off, the bias voltage applied to the body of transistor 310 is raised to Vcc. Consequently, the leakage current of transistor 310 when transistor 310 is in inactive mode is kept relatively low.

It should be appreciated that circuit 320 is one of many ways for providing a current source known in the art. Consequently, this invention should not be limited to current source 320 described above.

FIG. 4 illustrates a circuit for controlling the drain current of a transistor for another embodiment in accordance with the present invention. Circuit 400 is similar to circuit 200 and need not be described in great detail here. Circuit 400 includes a NOR gate 421, and a source voltage detector 440 coupled to a source voltage supply providing a source voltage, Vcc. Source voltage detector 440 detects the source voltage and applies a low voltage to NOR gate 421 if the source voltage is lower than a predetermined high source voltage. Otherwise voltage detector 440 applies Vcc. When NOR gate 421 receives a low voltage and gate 412 is driven low, the output of gate 421 is high and the output of inverter 422 is low, causing body 415 to be forward biased. The high source voltage used in an application is an implementation detail, and the present invention is not limited to any particular high source voltage. For example, for one embodiment, the gate voltage is coupled to inverter 421 if the source voltage is less than 3.3 volts.

Circuit 400 allows transistors whose gate oxide is thick, causing the transistor to have a relatively large threshold voltage, to have a larger drain current than would otherwise be possible. Typically, a transistor is designed with a large gate oxide thickness in order to protect the transistor from punch through of the gate when used with large source voltages. Unfortunately, large gate oxide thickness results in a large threshold voltage. A large threshold voltage may have a detrimental effect on the drain current when a relatively small source voltage is applied to the transistor. This detrimental effect can be demonstrated by first noting that the relationship between threshold voltage, Vt, and drain current (Ids) can be expressed by k*(Vgs–Vt). When the source voltage decreases Vgs decreases but the threshold voltage remains substantially the same. It is desirable to decrease the threshold voltage when Vgs is decreased. By biasing the body, the threshold voltage can be decreased, increasing the drain current even though the source voltage has decreased. Consequently, transistors, which would otherwise have to be made larger in order to increase the drain current, can be used in their original size and with a lower source supply voltage. Thus, circuit 400 provides the ability to use two (or more) different source supply voltages with the same transistor by allowing the transistor's threshold voltage to be dynamically decreased, improving the transistor's drain current at the lower supply voltage.

While in the above description detector 440 is placed in parallel with NOR gate 412. While in the above description detector 420 is used with circuit 200 of FIG. 2, it should be appreciated that for an alternative embodiment in accordance with the present invention detector 440 can be used with circuit 300 of FIG. 3a. In such an alternative embodiment, detector 440 couples the output of the direct current source 320 to the tap (not shown) of transistor 310 when the source supply voltage is below the high source voltage.

While in the above description a voltage detector 440 is used to dynamically adjust the threshold voltage, it should be appreciated that in alternative embodiments a switch(es) or jumper(s) can be set by a user to select from two or more voltages each of which causes a current source such as source 320 to generate an associated bias for application to the body of a transistor.

While transistors 210, 310, and 410 are PMOS transistors according to some embodiments of the present invention, it should be appreciated that in alternative embodiments in accordance with the present invention transistors 210, 310, and 410 can be NMOS transistors if the body is accessible.

Thus, a method and apparatus for generating reference voltages has been described. Although the present invention has been described with reference to specific exemplary embodiments, it will be appreciated by one of ordinary skill in the art that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A semiconductor circuit, comprising:
    a power supply node that is to provide a supply voltage;
    a first current source;
    at least one field effect transistor having a source, a body coupled to the first current source; and the source coupled to the power supply node, wherein the at least one field effect transistor is at least one p-channel field effect transistor (PFET transistor) and the body is an n-type body, wherein the first current source is a current mirror having a first transistor and a second transistor.

2. The circuit of claim 1, wherein the at least one PFET transistor has a gate, and the first current source biases the n-type body when the gate is driven.

3. The circuit of claim 1, wherein the at least one PFET transistor has a gate, and the first current source forward biases the n-type body when the gate is driven low.

4. The circuit of claim 1, wherein the at least one PFET transistor has a gate, and the first current source couples the n-type body to the power supply node when the gate is driven high.

5. The current of claim 1, wherein the at least one PFET transistor has a gate and a drain, and an electric static discharge received at the drain is isolated from the gate.

6. The circuit of claim 1, wherein the first current source is to lower a threshold voltage of the at least one PFET transistor when the n-type body is driven by a first voltage.

7. The circuit of claim 1, wherein the first current source is to increase a threshold voltage of the at least one PFET transistor when the n-type body is driven by a second voltage.

8. The circuit of claim 1, wherein the at least one PFET transistor has a tap coupled to the n-type body, and the first current source is coupled to then-type body through the tap.

9. The circuit of claim 8, wherein the tap is n+ type material.

10. The circuit claim 1, wherein the first transistor has a first width that is larger than a second width of the second transistor.

* * * * *